(12) United States Patent
Lee et al.

(10) Patent No.: US 12,027,495 B2
(45) Date of Patent: Jul. 2, 2024

(54) SEMICONDUCTOR DEVICES HAVING A CONDUCTIVE PILLAR AND METHODS OF MANUFACTURING THE SAME

(71) Applicant: SAMSUNG ELECTRONICS CO., LTD., Suwon-si (KR)

(72) Inventors: Kun Sil Lee, Hwaseong-si (KR); Dong Kwan Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 346 days.

(21) Appl. No.: 17/316,044

(22) Filed: May 10, 2021

(65) Prior Publication Data
US 2021/0280562 A1 Sep. 9, 2021

Related U.S. Application Data

(63) Continuation of application No. 16/415,058, filed on May 17, 2019, now Pat. No. 11,031,375.

(30) Foreign Application Priority Data

Dec. 7, 2018 (KR) .................. 10-2018-0157071

(51) Int. Cl.
*H01L 25/065* (2023.01)
*H01L 21/56* (2006.01)
(Continued)

(52) U.S. Cl.
CPC ........ *H01L 25/0657* (2013.01); *H01L 21/565* (2013.01); *H01L 21/76804* (2013.01);
(Continued)

(58) Field of Classification Search
CPC ... H01L 25/0657; H01L 25/50; H01L 21/565; H01L 21/76804; H01L 21/76819;
(Continued)

(56) References Cited

U.S. PATENT DOCUMENTS 8,980,691 B2 3/2015 Lin
9,368,438 B2 6/2016 Lin et al.
(Continued)

*Primary Examiner* — Tu-Tu V Ho
(74) *Attorney, Agent, or Firm* — Sughrue Mion, PLLC

(57) ABSTRACT

A method of manufacturing a semiconductor package includes forming a first redistribution structure, forming a plurality of conductive pillars on the first redistribution structure, mounting the first semiconductor chip on the first redistribution structure, forming an encapsulant configured to cover an upper surface of the first redistribution structure, the plurality of conductive pillars, and the first semiconductor chip, planarizing the encapsulant, exposing the plurality of conductive pillars by forming an opening in the planarized encapsulant, and forming a second redistribution structure connected to the plurality of conductive pillars on the first semiconductor chip and the encapsulant. Upper surfaces of the plurality of conductive pillars are located at a lower level than the upper surface of the first semiconductor chip, and an upper surface of a connection via included in the second redistribution structure has a width greater than a width of a lower surface of the connection via.

15 Claims, 7 Drawing Sheets

(51) Int. Cl.
  *H01L 21/768* (2006.01)
  *H01L 23/522* (2006.01)
  *H01L 23/528* (2006.01)
  *H01L 23/532* (2006.01)
  *H01L 25/00* (2006.01)
  *H01L 23/00* (2006.01)
  *H01L 23/31* (2006.01)

(52) U.S. Cl.
  CPC .. *H01L 21/76819* (2013.01); *H01L 21/76849* (2013.01); *H01L 21/76885* (2013.01); *H01L 23/5226* (2013.01); *H01L 23/5283* (2013.01); *H01L 23/53223* (2013.01); *H01L 25/50* (2013.01); *H01L 21/7685* (2013.01); *H01L 23/315* (2013.01); *H01L 24/81* (2013.01); *H01L 2221/101* (2013.01); *H01L 2224/02331* (2013.01); *H01L 2224/02372* (2013.01); *H01L 2224/02379* (2013.01); *H01L 2225/06548* (2013.01)

(58) Field of Classification Search
  CPC ......... H01L 21/76849; H01L 21/76885; H01L 21/7685; H01L 23/5226; H01L 23/5283; H01L 23/53223; H01L 23/315; H01L 24/81; H01L 2221/101; H01L 2224/02331; H01L 2224/02372; H01L 2224/02379; H01L 2225/06548

USPC ...................................................... 438/613
  See application file for complete search history.

(56) References Cited

U.S. PATENT DOCUMENTS

| | | |
|---|---|---|
| 9,397,080 B2 | 7/2016 | Hsu et al. |
| 9,825,005 B2 | 11/2017 | Yeh et al. |
| 9,831,142 B2 | 11/2017 | Baek et al. |
| 10,049,964 B2 | 8/2018 | Shim et al. |
| 2011/0068427 A1 | 3/2011 | Paek et al. |
| 2011/0278736 A1 | 11/2011 | Lin et al. |
| 2013/0037929 A1 | 2/2013 | Essig et al. |
| 2014/0048906 A1 | 2/2014 | Shim et al. |
| 2014/0103527 A1 | 4/2014 | Marimuthu et al. |
| 2014/0183731 A1 | 7/2014 | Lin et al. |
| 2014/0264808 A1* | 9/2014 | Wolter ................ H01L 23/3128 257/774 |
| 2015/0001708 A1 | 1/2015 | Lin |
| 2015/0187746 A1 | 7/2015 | Hsu et al. |
| 2016/0197057 A1 | 7/2016 | Umemoto et al. |
| 2017/0053898 A1 | 2/2017 | Yeh et al. |
| 2017/0133288 A1 | 5/2017 | Baek et al. |
| 2017/0179033 A1 | 6/2017 | West et al. |
| 2017/0323868 A1 | 11/2017 | Park et al. |
| 2018/0061805 A1 | 3/2018 | Fang et al. |
| 2019/0319000 A1* | 10/2019 | Lin ..................... H01L 23/3185 |
| 2020/0273804 A1 | 8/2020 | Jeon et al. |

\* cited by examiner

SEMICONDUCTOR DEVICES HAVING A CONDUCTIVE PILLAR AND METHODS OF MANUFACTURING THE SAME

CROSS-REFERENCE TO THE RELATED APPLICATION

This is a continuation application based on U.S. application Ser. No. 16/415,058 filed May 17, 2019, which claims priority from Korean Patent Application No. 10-2018-0157071, filed on Dec. 7, 2018, in the Korean Intellectual Property Office, the disclosures of which are herein incorporated by reference in their entireties.

BACKGROUND

1. Field

Devices and methods consistent with example embodiments relate to semiconductor devices having a conductive pillar and methods of manufacturing the same.

2. Description of Related Art

As semiconductor devices are becoming highly integrated, a technique for integrating and miniaturizing a semiconductor chip and a semiconductor package on which a semiconductor chip is mounted is being highlighted. A fan-out wafer-level packaging technology in which a redistribution layer is formed below a semiconductor chip instead of a printed circuit board in order to make a semiconductor package thinner has been developed. As a semiconductor chip is becoming miniaturized, an interval between solder balls is reduced so that there is a problem in that handling of the solder balls becomes difficult. In order to address this problem, a fan-out wafer-level package has been proposed.

SUMMARY

One or more example embodiments provide a semiconductor device having a conductive pillar whose upper surface is located at a lower level than an upper surface of a semiconductor chip.

The example embodiments of the disclosure are directed to providing a method of manufacturing a semiconductor package which includes grinding an encapsulant and forming an opening in an upper portion of the encapsulant such that a conductive pillar is exposed.

According to example embodiments, there is provided a method of manufacturing a semiconductor package which includes forming a first redistribution structure on a first carrier, forming a plurality of conductive pillars on the first redistribution structure by using a mask pattern, mounting a first semiconductor chip on the first redistribution structure to be adjacent to the plurality of conductive pillars, forming an encapsulant configured to cover an upper surface of the first redistribution structure, the plurality of conductive pillars, and the first semiconductor chip, planarizing the encapsulant such that an upper surface of the first semiconductor chip is exposed, exposing the plurality of conductive pillars by forming an opening in the planarized encapsulant, and forming a second redistribution structure on the first semiconductor chip and the encapsulant, the second redistribution structure being connected to the plurality of conductive pillars. Upper surfaces of the plurality of conductive pillars may be located at a lower level than the upper surface of the first semiconductor chip. The second redistribution structure may include an interconnection pattern and a connection via configured to connect the interconnection pattern to the plurality of conductive pillars, and an upper surface of the connection via has a width greater than a width of a lower surface of the connection via.

According to example embodiments, there is provided a method of manufacturing a semiconductor package which includes forming a first redistribution structure on a first carrier, forming a plurality of conductive pillars on the first redistribution structure by using a mask pattern, mounting a first semiconductor chip on the first redistribution structure to be adjacent to the plurality of conductive pillars, forming an encapsulant configured to cover an upper surface of the first redistribution structure, the plurality of conductive pillars, and the first semiconductor chip, planarizing the encapsulant such that an upper surface of the first semiconductor chip is exposed, exposing the plurality of conductive pillars by forming an opening in the planarized encapsulant, forming a corrosion preventive layer on the plurality of exposed conductive pillars, and forming a second redistribution structure on the encapsulant, the second redistribution structure being connected to the plurality of conductive pillars. Upper surfaces of the plurality of conductive pillars may be located at a lower level than the upper surface of the first semiconductor chip. The second redistribution structure may include an interconnection pattern and a connection via configured to connect the interconnection pattern to the plurality of conductive pillars, and an upper surface of the connection via has a width greater than a width of a lower surface of the connection via.

According to example embodiments, there is provided a semiconductor package which includes a first redistribution structure, a first semiconductor chip disposed on the first redistribution structure chip, a plurality of conductive pillars disposed on the first redistribution structure to be adjacent to the first semiconductor chip, an encapsulant configured to cover an upper surface of the first redistribution structure, the plurality of conductive pillars, and side surfaces of the first semiconductor chip, and a second redistribution structure disposed on the encapsulant and connected to the plurality of conductive pillars. Upper surfaces of the plurality of conductive pillars may be located at a lower level than the upper surface of the first semiconductor chip. The second redistribution structure may include an interconnection pattern and a connection via configured to connect the interconnection pattern to the plurality of conductive pillars, and an upper surface of the connection via has a width greater than a width of a lower surface of the connection via.

BRIEF DESCRIPTION OF THE DRAWINGS

These and/or other aspects will become apparent and more readily appreciated from the following description of the embodiments, taken in conjunction with the accompanying drawing, in which.

DETAILED DESCRIPTION

Figure 1:
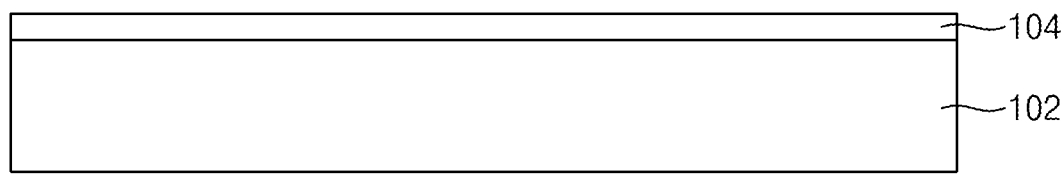
FIGS. 1 to 9 are cross-sectional views for describing a method of manufacturing a semiconductor package according to an example embodiment.

Hereinafter, a method of manufacturing the semiconductor package 100 according to the example embodiment configured as described above will be described with reference to the accompanying drawings. Aspects of example embodiments will be more clearly understood from the following embodiments described in detail with reference to the accompanying drawings. Throughout the drawings and the detailed description, unless otherwise described, the same drawing reference numerals will be understood to refer to the same elements, features, and structures. The relative size and depiction of these elements may be exaggerated for clarity, illustration, and convenience.

It will be understood that, although the terms first, second, etc. may be used herein to describe various elements, these elements should not be limited by these terms. These terms are only used to distinguish one element from another. Any references to singular may include plural unless expressly stated otherwise. In addition, unless explicitly described to the contrary, an expression such as "comprising" or "including" will be understood to imply the inclusion of stated elements but not the exclusion of any other elements. Also, the terms, such as 'part', 'unit' or 'module', etc., should be understood as a unit that performs at least one function or operation and that may be embodied as hardware, software, or a combination thereof.

FIGS. 1 to 9 and 11 to 14 are cross-sectional views for describing a method of manufacturing a semiconductor package according to an example embodiment.

The method of manufacturing the semiconductor package according to the example embodiment may include providing a first carrier, forming a first redistribution structure on the first carrier, forming conductive pillars on the first redistribution structure by using a mask pattern, mounting a first semiconductor chip on the first redistribution structure to be adjacent to the plurality of conductive pillars, forming an encapsulant surrounding an upper surface of the first redistribution structure, the plurality of conductive pillars, and the first semiconductor chip, planarizing the encapsulant such that an upper surface of the first semiconductor chip is exposed, exposing the plurality of conductive pillars by forming an opening in an upper portion of the planarized encapsulant, and forming a second redistribution structure connected to the conductive pillars on the first semiconductor chip and the encapsulant. Further, the method of manufacturing the semiconductor package according to the example embodiment may further include mounting a second semiconductor chip on the second redistribution structure and forming an encapsulant covering an upper surface of the second redistribution structure and the second semiconductor chip. This is merely an example embodiment and the disclosure is not limited to.

Hereinafter, a method of manufacturing the semiconductor package 100 according to the example embodiment configured as described above will be described with reference to FIGS. 1 to 9 and 11 to 14.

Referring to FIG. 1, a process of providing a first carrier 102 is performed. A release film 104 may be disposed on the first carrier 102. The first carrier 102 may be a glass carrier, a ceramic carrier, a silicon wafer, or the like. The release film 104 may be composed of multiple layers and may include, for example, an adhesive layer and a release layer. The release film 104 may serve to bond a structure to be formed thereon to the first carrier 102. Further, the release film 104 may be removed together with the first carrier 102 from an upper structure which will be described below and may include a polymer-based material. In an example embodiment, the release film 104 may include a light-to-heat-conversion (LTHC) release coating material and may be thermal-released by heating. In an example embodiment, the release film 104 may include an ultraviolet (UV) adhesive which is released by UV light. Further, the release film 104 may be released by a physical method. The release film 104 may be applied in a liquid or cured state or may be a laminate film laminated on the first carrier 102. An upper surface of the release film 104 may be flattened and may have a high coplanarity.

Figure 2:
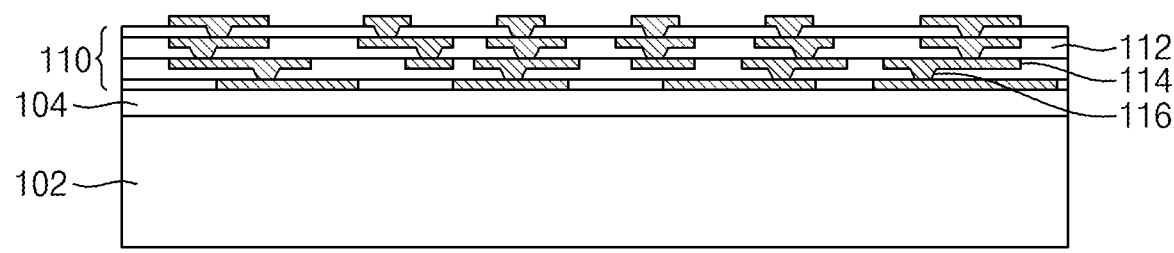

Referring to FIG. 2, a process of forming a first redistribution structure 110 on the first carrier 102 is performed. For example, the first redistribution structure 110 may be disposed on the release film 104. The first redistribution structure 110 may include an interlayer insulating layer 112, an interconnection pattern 114, and a via 116.

The interlayer insulating layer 112 and the interconnection pattern 114 may be stacked in at least one layer. The via 116 may electrically connect interconnection patterns 114 of different layers to each other and may have various shapes such as, for example but not limited to, a cylindrical shape and/or a tapered shape. Further, the via 116 may be disposed to be integrated with the interconnection pattern 114. The interlayer insulating layer 112 may electrically insulate the interconnection pattern 114 and the via 116 from the outside.

The interlayer insulating layer 112 may include a photosensitive material that can be patterned by using a photolithography process. For example, the interlayer insulating layer 112 may include a polymer such as polybenzoxazole (PBO), polyimide, benzocyclobutene (BCB), or the like. In an example embodiment, the interlayer insulating layer 112 may include silicon nitride, silicon oxide, phosphosilicate glass (PSG), borosilicate glass (BSG), boron-doped phosphosilicate glass (BPSG), or a combination thereof. The interlayer insulating layer 112 may be formed by processes such as a chemical vapor deposition (CVD) process, a lamination process, a spin coating process, and the like.

The process of forming the first redistribution structure 110 may include forming the interconnection pattern 114 on the release film 104. The forming of the interconnection pattern 114 may include forming a barrier layer and a seed layer (not shown) on the interlayer insulating layer 112, forming a patterned mask (not shown) such as a photoresist or the like on the seed layer, and forming a conductive material on the exposed seed layer. The forming of the conductive material may include a plating process. Thereafter, the patterned mask and portions of the barrier layer and the seed layer which are covered by the patterned mask are removed, and the interconnection pattern 114 is formed. The first redistribution structure 110 may be formed as shown in FIG. 2 by repeating a process of forming the interconnection pattern 114 and the via 116 and covering the interconnection pattern 114 and the via 116 with the interlayer insulating layer 112.

The barrier layer may include at least one selected from Ta, Ti, W, Ru, V, Co, and Nb. The seed layer may include at least one selected from Al, Ti, Cr, Fe, Co, Ni, Cu, Zn, Pd, Pt, Au, and Ag. In an example embodiment, the barrier layer may include Ti and the seed layer may include Cu. The barrier layer and the seed layer may be formed by a physical vapor deposition (PVD) process, a CVD process, or an atomic layer deposition (ALD) process.

The interconnection pattern 114 and the via 116 may include a metal such as Al, Ti, Cr, Fe, Co, Ni, Cu, Zn, Pd, Pt, Au, or Ag. In an example embodiment, the interconnection pattern 114 and the via 116 may include copper. The interconnection pattern 114 and the via 116 may be formed by an electrochemical plating process, an electroless plating process, a PVD process, a CVD process, a spin-on process, or a combination thereof. In an example embodiment, the interconnection pattern 114 and the via 116 may be formed by a damascene process.

Figure 3:
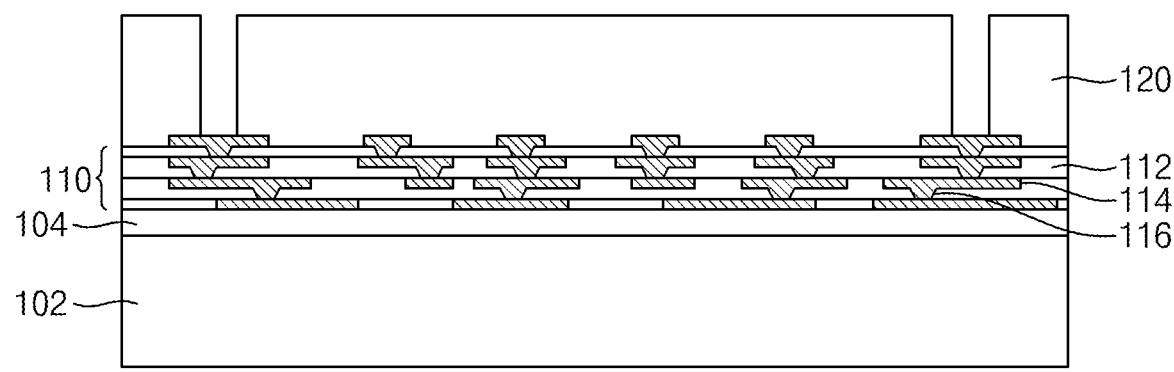
Figure 4:
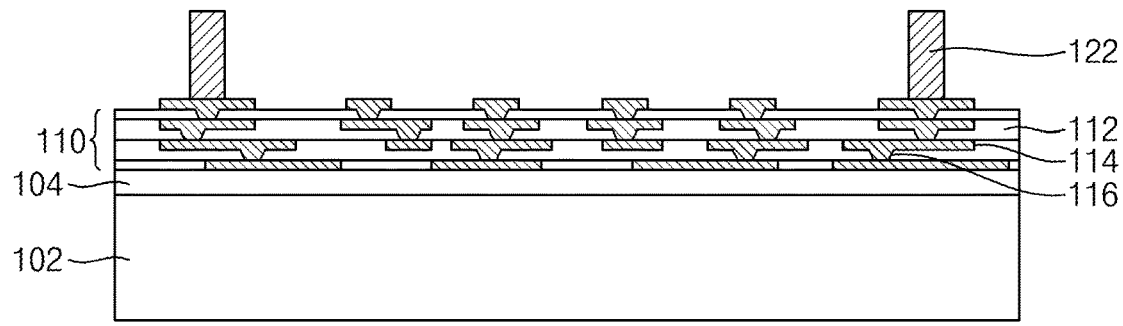

Referring to FIGS. 3 and 4, a process of forming a conductive pillar 122 on the first redistribution structure 110 is performed. For example, a plurality of conductive pillars 122 may be disposed on the first redistribution structure 110. The plurality of conductive pillars 122 may be disposed on the interconnection pattern 114 of an uppermost layer of the first redistribution structure 110.

Referring to FIG. 3, a mask pattern 120 may be disposed on an upper surface of the first redistribution structure 110. A portion of the upper surface of the first redistribution structure 110 may be exposed by the mask pattern 120. For example, the interconnection pattern 114 to be connected to the conductive pillar 122 may be exposed by the mask pattern 120. Referring to FIG. 4, the conductive pillar 122 may be disposed on the portion of the upper surface of the first redistribution structure 110 which is exposed by the mask pattern 120.

The forming of the conductive pillar 122 may include forming a barrier layer and a seed layer (not shown), forming the mask pattern 120 on the seed layer, and filling the portion exposed by the mask pattern 120 with a conductive material. Thereafter, the mask pattern 120 and portions of the barrier layer and the seed layer which are covered by the mask pattern 120 may be removed.

Although not shown, the barrier layer and the seed layer may be formed on the upper surface of the first redistribution structure 110. In an example embodiment, the barrier layer may include Ti and the seed layer may include Cu. The barrier layer and the seed layer may be formed by a PVD process, a CVD process, an ALD process, or the like.

The mask pattern 120 may be formed on the seed layer. The mask pattern 120 may be formed by a spin coating process or the like and may be exposed to light for patterning. The mask pattern 120 may define a region in which the conductive pillar 122 will be disposed. The conductive material may be formed in an opening of the mask pattern 120 and on the exposed portion of the seed layer. The conductive material may be formed, for example, by plating such as electroplating, electroless plating, or the like. The conductive material may include a metal such as Cu, Ti, W, Al, or the like. In an example embodiment, the conductive material may include Cu. The mask pattern 120 and a portion of the seed layer on which the conductive material is not formed may be removed. The mask pattern 120 may be removed by a release process in which an oxygen plasma or the like is used. After the mask pattern 120 is removed, the barrier layer and the exposed portion of the seed layer may be removed by wet or dry etching. The barrier layer, a remaining portion of the seed layer, and the conductive material may form the conductive pillar 122.

As shown in FIGS. 3 and 4, since the conductive pillars 122 are formed by using the mask pattern 120, the conductive pillars 122 may be arranged in various forms as compared with the case in which a provided connection structure is disposed on the first redistribution structure 110. For example, an interval between the conductive pillars 122 may vary and the arrangement of the conductive pillars 122 may vary according to a size or a width of the semiconductor chip. Further, the conductive pillars 122 may be formed to have different diameters.

Figure 5:
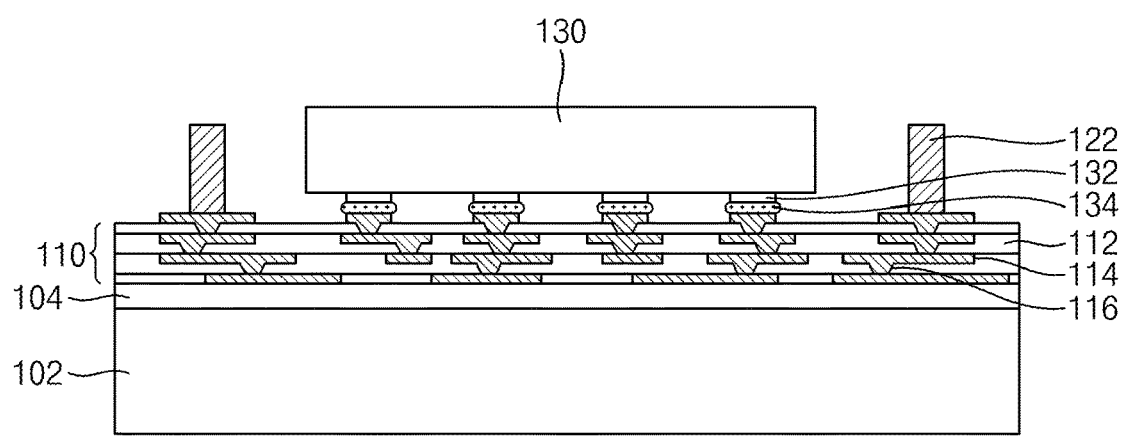

Referring to FIG. 5, a process of mounting a first semiconductor chip 130 on the first redistribution structure 110 to be adjacent to the conductive pillars 122 is performed. For example, the plurality of conductive pillars 122 may be disposed to surround the first semiconductor chip 130 when viewed from above.

The first semiconductor chip 130 may include bonding pads 132 disposed therebelow and bumps 134 disposed below the bonding pads 132. The bonding pad 132 may be electrically connected to the interconnection pattern 114 of the first redistribution structure 110 through the bump 134. In an example embodiment, the bonding pad 132 may include Cu and the bump 134 may include Sn.

An upper surface of the first semiconductor chip 130 may be located at a higher level than an upper surface of the conductive pillar 122. In FIG. 5, the first semiconductor chip 130 is shown as being flip-chip bonded on the first redistribution structure 110, but the disclosure is not limited thereto, and the first semiconductor chip 130 may be connected to the first redistribution structure 110 by wire bonding. In the case where the first semiconductor chip 130 is connected to the first redistribution structure 110 by the wire bonding, the upper surface of the first semiconductor chip 130 may be located at a higher level than the upper surface of the conductive pillar 122.

Figure 6:
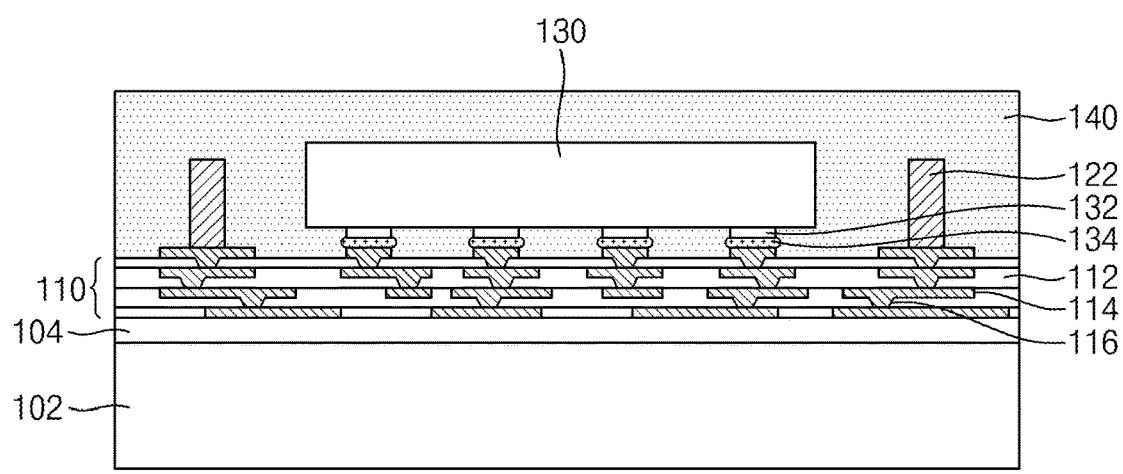

Referring to FIG. 6, a process of forming an encapsulant 140 surrounding the upper surface of the first redistribution structure 110, the conductive pillar 122, and the first semiconductor chip 130 is performed. In an example embodiment, the encapsulant 140 may be formed by a molded underfill method and may fill a space between the upper surface of the first redistribution structure 110 and a lower surface of the first semiconductor chip 130. In an example embodiment, an underfill may be formed between the upper surface of the first redistribution structure 110 and the lower surface of the first semiconductor chip 130 before the encapsulant 140 is formed. The encapsulant 140 may protect the conductive pillar 122 and the first semiconductor chip 130 from external influences such as impacts or the like.

The encapsulant 140 may be a resin including an epoxy or polyimide. For example, the encapsulant 140 may include a bisphenol-based epoxy resin, a polycyclic aromatic epoxy resin, an o-cresol novolac epoxy resin, a biphenyl-based epoxy resin, a naphthalene-based epoxy resin, or the like.

Figure 7:
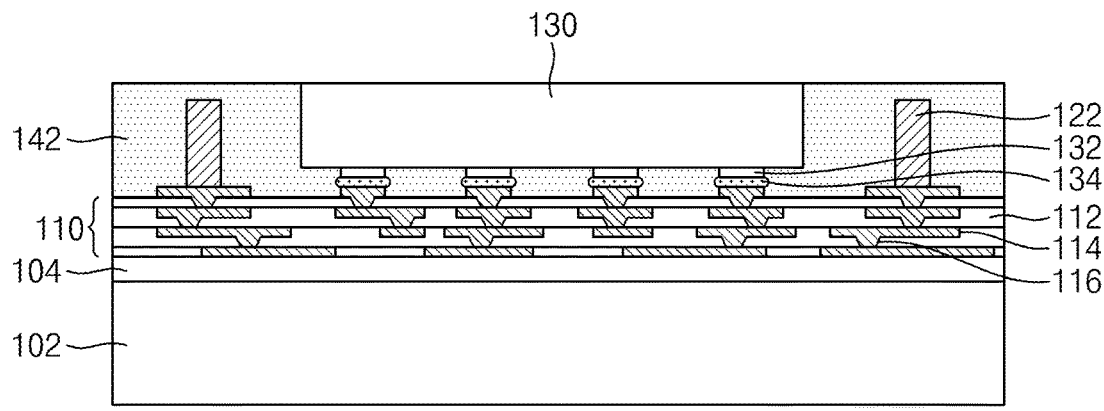

Referring to FIG. 7, a process of planarizing the encapsulant 140 such that the upper surface of the first semiconductor chip 130 is exposed is performed. The encapsulant 140 may be planarized to form an encapsulant 142. The encapsulant 142 may be planarized by partially grinding an upper portion thereof. Since the upper surface of the conductive pillar 122 is located at a lower level than the upper surface of the first semiconductor chip 130, the conductive pillar 122 may not be exposed by the planarization process.

Generally, in a grinding process, when the conductive pillar 122 is simultaneously planarized with the semiconductor chip, the upper surface of the conductive pillar 122 may be partially removed and a residue and/or a burr may be formed. The residue and/or the burr may cause a reduction in the reliability of the redistribution layer formed on the semiconductor chip. In the method of manufacturing the semiconductor package of the disclosure, since the conductive pillar 122 is not exposed to the outside in the planarization process of the encapsulant 140, a contamination problem due to the residue and/or the burr may be prevented or suppressed.

Since the upper surface of the conductive pillar 122 is located at a lower level than the upper surface of the first semiconductor chip 130, the encapsulant 140 and upper silicon of the first semiconductor chip 130 may be removed during the grinding process. In the method of manufacturing the semiconductor package according to an example embodiment of the disclosure, since the conductive pillar 122 is not removed during the grinding process, the upper surface of the encapsulant 140 may be uniformly cut during the grinding process. For example, a surface roughness Ra of the upper surface of the encapsulant 142 may be 0.1 μm or less.

Figure 8:
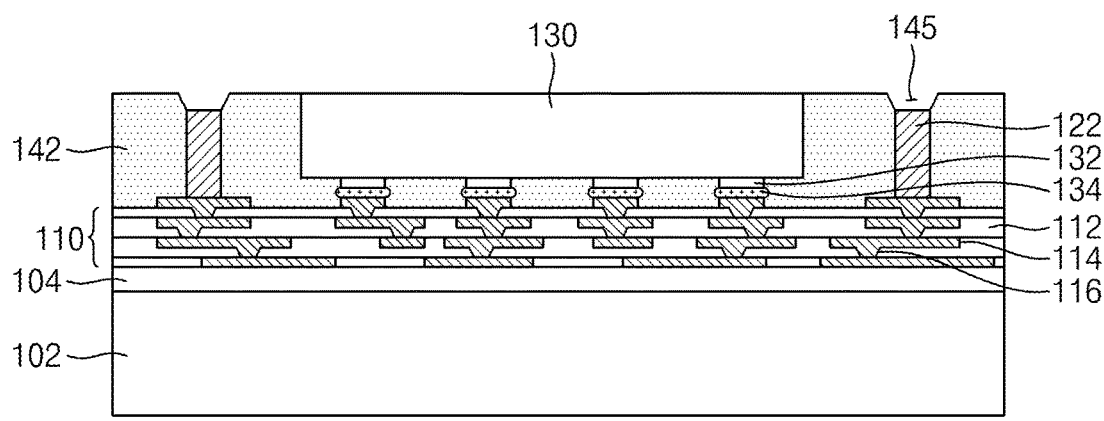

Referring to FIG. 8, a process of exposing the conductive pillar 122 by forming an opening 145 in an upper portion of the encapsulant 142 is performed. The upper portion of the encapsulant 142 may be partially removed. For example, the upper portion of the encapsulant 142 may be partially removed by using a laser drilling process. A carbon dioxide gas laser beam, a UV laser beam, or an excimer laser beam may be used in the laser drilling process. The opening 145 may have a shape which is tapered downward from the upper surface of the encapsulant 142. The upper surface of the conductive pillar 122 may be exposed through the opening 145.

Figure 9:
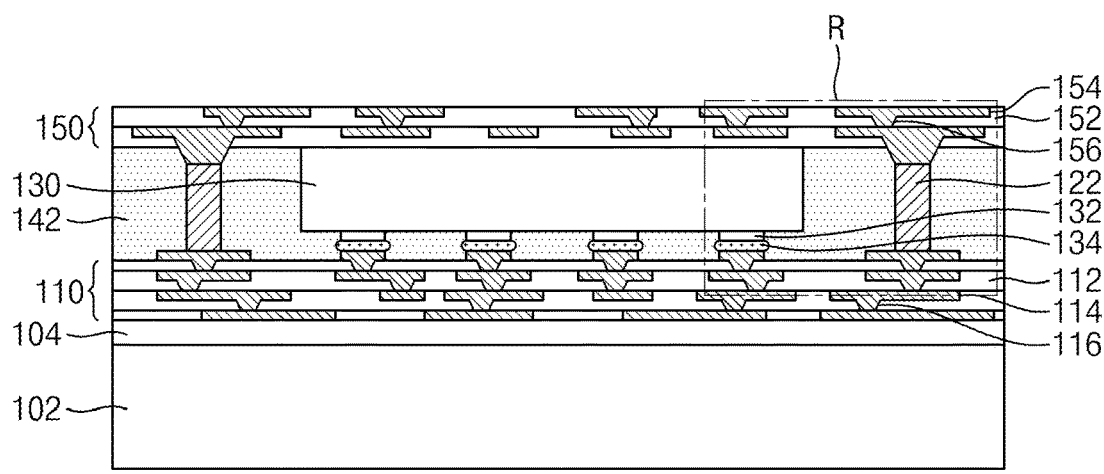

Referring to FIG. 9, a process of forming a second redistribution structure 150, which is connected to the conductive pillar 122, on the first semiconductor chip 130 and the encapsulant 142 is performed. A detailed description of a configuration of the second redistribution structure 150 similar to or the same as that of the first redistribution structure 110 may be omitted.

Figure 10:
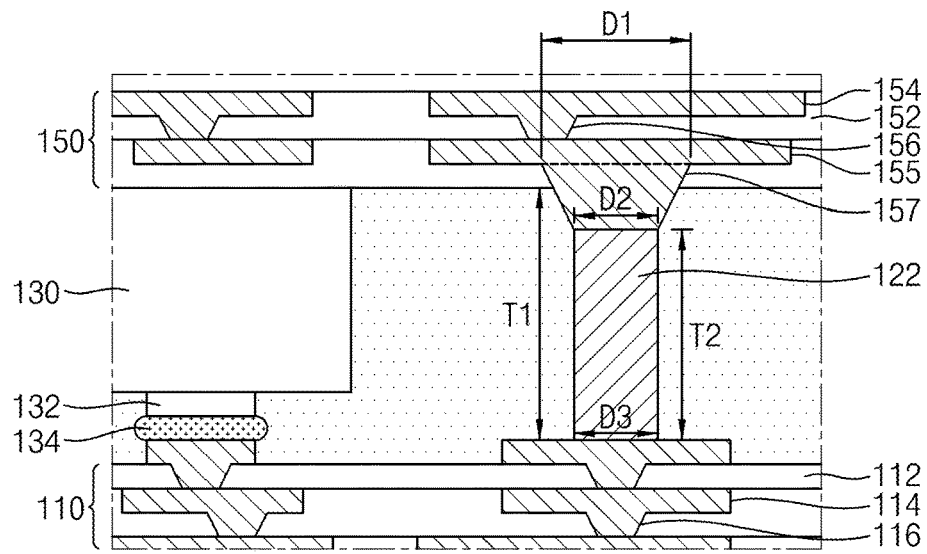
FIG. 10 is a partially enlarged view of the semiconductor package shown in FIG. 9.

FIG. 10 is a partially enlarged view of the semiconductor package shown in FIG. 9. FIG. 10 corresponds to a region R shown in FIG. 9. Referring to FIG. 10, the second redistribution structure 150 may include an interlayer insulating layer 152, interconnection patterns 154 and 155, a via 156, and a connection via 157. The interlayer insulating layer 152 and the interconnection patterns 154 and 155 may be stacked in at least one layer. The via 156 may electrically connect the interconnection patterns 154 and 155 of different layers to each other.

The interlayer insulating layer 152 may be formed on the first semiconductor chip 130 and the encapsulant 142. The interlayer insulating layer 152 may be patterned and may define positions at which the interconnection patterns 154 and 155, the via 156, and the connection via 157 are formed. Although not shown, a barrier layer and a seed layer may be formed on the interlayer insulating layer 152 and the conductive pillar 122. The interconnection patterns 154 and 155 and the connection via 157 may be formed by filling the seed layer with a conductive material. The interconnection patterns 154 and 155, the via 156, and the connection via 157 may be formed by processes such as CVD, ALD, plating, and the like.

The connection via 157 may fully fill the opening 145 and may connect the conductive pillar 122 to the interconnection pattern 155. The interconnection pattern 155 and the connection via 157 may be integrally formed. For example, the interconnection pattern 155 and the connection via 157 may be formed by a damascene process. The connection via 157 may have a shape of a truncated cone. For example, a first diameter D1 may be greater than a second diameter D2. Here, the first diameter D1 may refer to a diameter of an upper surface of the connection via 157 shown in FIG. 10, and the second diameter D2 may refer to a diameter of a lower end of the connection via 157. The upper surface of the connection via 157 may be located at a higher level than the upper surface of the encapsulant 142, and the lower surface of the connection via 157 may be located at a lower level than the upper surface of the encapsulant 142. Here, the upper surface of the encapsulant 142 may refer to a portion in which the opening 145 is not formed after the grinding process. Further, the second diameter D2 may refer to a diameter of an upper portion of the conductive pillar 122 and a third diameter D3 may refer to a diameter of a lower end of the conductive pillar 122. The second diameter D2 may be substantially identical to the third diameter D3, but the disclosure is not limited thereto. In an example embodiment, the second diameter D2 may be greater than the third diameter D3.

In the method of manufacturing the semiconductor package according to the example embodiment of the disclosure, since the upper surface of the conductive pillar 122 is formed at a lower level than the upper surface of the first semiconductor chip 130, a first thickness T1 may be greater than a second thickness T2. Here, the first thickness T1 may refer to a distance from a lower surface of the conductive pillar 122 to the upper surface of the encapsulant 142, and the second thickness T2 may refer to a distance from the lower surface of the conductive pillar 122 to the lower end of the connection via 157. A ratio of the second thickness T2 to the first thickness T1 may be 0.8 or less.

In the method of manufacturing the semiconductor package according to the example embodiment of the disclosure, since the conductive pillar 122, which connects the first redistribution structure 110 to the second redistribution structure 150, is formed on the first redistribution structure 110 by using the mask pattern 120, the conductive pillar 122 may have a columnar shape. Further, the diameter of the conductive pillar 122 may be substantially constant, and the conductive pillar 122 may not have a protrusion which protrudes in a radial direction.

Figure 11:
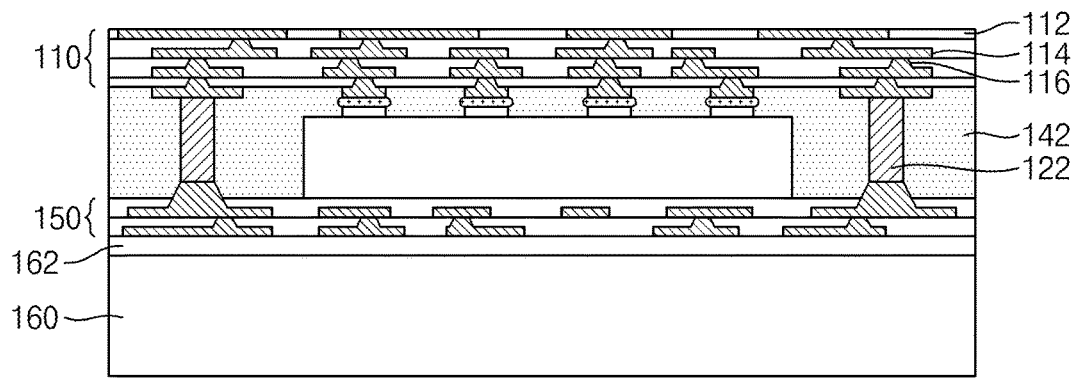
FIGS. 11 to 14 are cross-sectional views for describing a method of manufacturing a semiconductor package according to an example embodiment.

Referring to FIG. 11, the first carrier 102 may be separated from the first redistribution structure 110 and a second carrier 160 may be formed on the second redistribution structure 150. The first carrier 102 may be separated by a debonding process of the release film 104 while the resultant shown in FIG. 9 is inverted. In an example embodiment, the debonding process may include a process of projecting light, such as laser light or UV light, onto the release film 104. The release film 104 may be disintegrated by heat of the light and the first carrier 102 may be separated from the first redistribution structure 110.

The second carrier 160 may be formed before the first carrier 102 is separated. A release film 162 may further be disposed between the second carrier 160 and the second redistribution structure 150. The second carrier 160 may be located on a surface opposite to a surface on which the second redistribution structure 150 is in contact with the first semiconductor chip 130. The second carrier 160 and the release film 162 may include the same material as the first carrier 102 and the release film 104, respectively.

Figure 12:
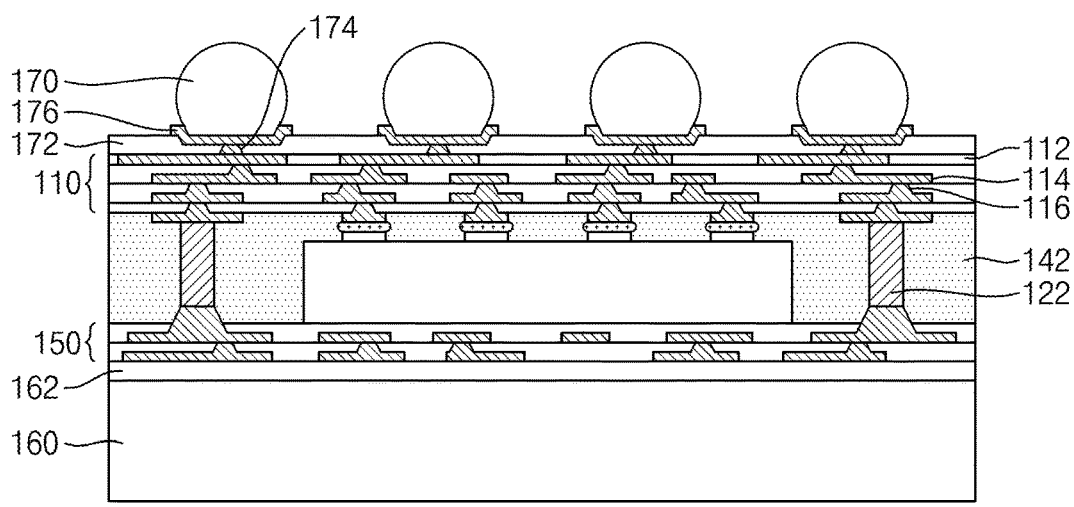

Referring to FIG. 12, external connecting members 170 may be formed on the first redistribution structure 110. The external connecting members 170 may be disposed on a surface opposite to a surface on which the first semiconductor chip 130 mounted on the first redistribution structure 110 is located. The external connecting member 170 may be connected to the interconnection pattern 154 of the first redistribution structure 110 by a via 174 and an under bump metal 176. An interlayer insulating layer 172 may be disposed on the interconnection pattern 114 of the first redistribution structure 110 and may cover the interconnection pattern 114 and the via 174. The under bump metal 176 may be disposed on the interlayer insulating layer 172.

The external connecting member 170 may include tin (Sn), silver (Ag), copper (Cu), palladium (Pd), bismuth (Bi), or antimony (Sb). The interlayer insulating layer 172 may include the same material as the interlayer insulating layer 112 and may include, for example, a polymer such as PBO, polyimide, BCB, or the like. The via 174 may include a metal such as Al, Ti, Cr, Fe, Co, Ni, Cu, Zn, Pd, Pt, Au, or Ag. In an example embodiment, the via 174 may include Cu. The under bump metal 176 may include chromium/chromium-copper alloy/copper (Cr/Cr—Cu/Cu), titanium-tungsten/alloy copper (Ti—W/Cu), aluminum/nickel/copper (Al/Ni/Cu), or nickel. The under bump metal 176 may be formed by a sputtering process, an electrolytic plating process, an electroless plating process, or the like.

Referring to FIGS. 5 to 9, although not shown, a plurality of first semiconductor chips 130 may be arranged on the first carrier 102 at predetermined intervals, and the plurality of conductive pillars 122 may be respectively disposed adjacent to the first semiconductor chips 130. As shown in FIG. 12, after the external connecting members 170 are formed, a sawing process may be further performed. Singulation may be performed on the plurality of first semiconductor chips 130 by using the sawing process.

Figure 13:
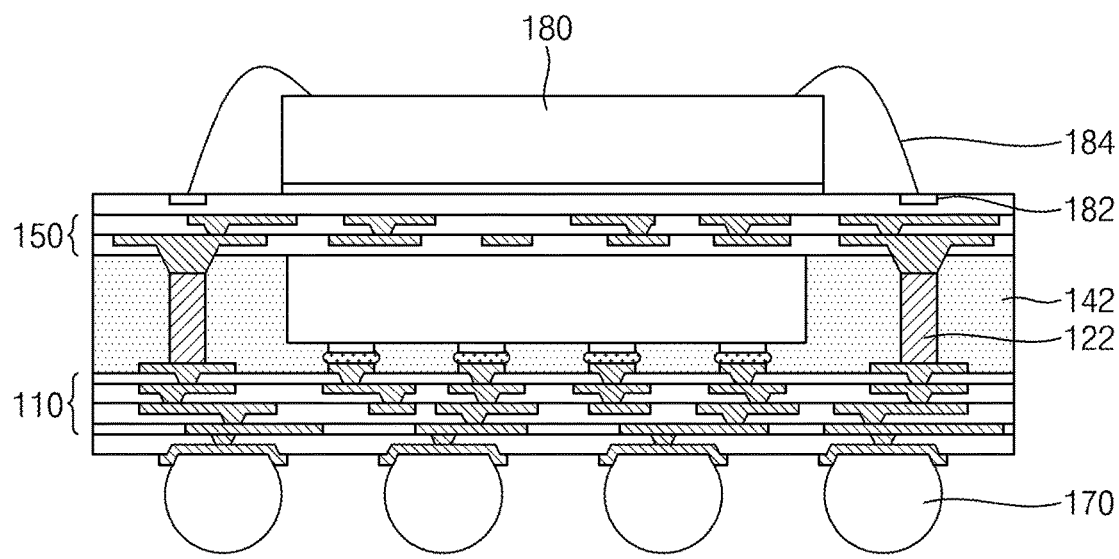

Referring to FIG. 13, a second semiconductor chip 180 may be mounted on the second redistribution structure 150, and the second carrier 160 may be removed. The second semiconductor chip 180 may be mounted on the second redistribution structure 150 by wire bonding. The second redistribution structure 150 may be electrically connected to the second semiconductor chip 180 by pads 182 and wires 184. An adhesive may be disposed on a lower surface of the second semiconductor chip 180 to fix the second semiconductor chip 180 to the second redistribution structure 150. In FIG. 13, the second semiconductor chip 180 is shown as being mounted by the wire bonding, but the disclosure is not limited thereto. In an example embodiment, the second semiconductor chip 180 may be connected to the second redistribution structure 150 by flip-chip bonding. The second carrier 160 may be separated from the second redistribution structure 150 by heat by irradiating laser light or UV light.

The second semiconductor chip 180 may function differently from the first semiconductor chip 130. For example, the first semiconductor chip 130 may be a logic chip such as an application process, and the second semiconductor chip 180 may be a memory chip such as a dynamic random access memory (DRAM), a static random access memory (SRAM), a not AND (NAND) flash memory, or the like.

Figure 14:
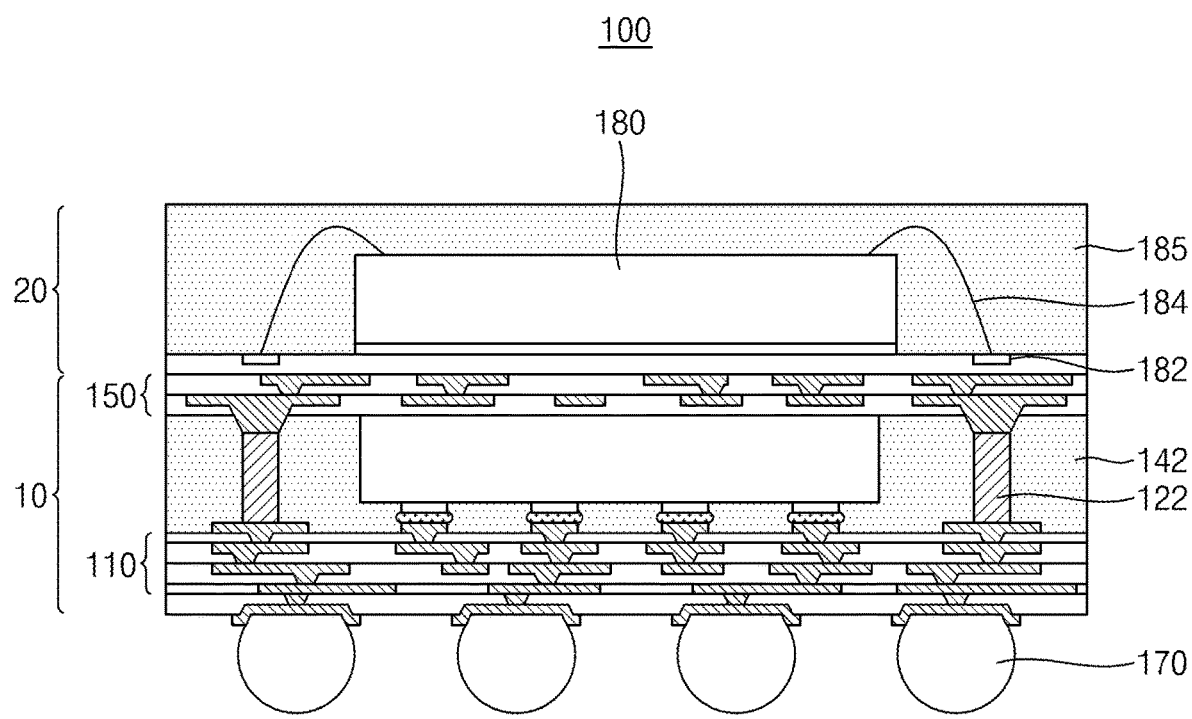

Referring to FIG. 14, a process of forming an encapsulant 185 which surrounds an upper surface of the second redistribution structure 150 and the second semiconductor chip 180 is performed. An upper surface of the encapsulant 185 may be located at a higher level than an upper surface of the second semiconductor chip 180, and the encapsulant 185 may cover an entirety of the second semiconductor chip 180 and an entirety of the wires 184. The encapsulant 185 may be a resin including an epoxy or polyimide.

The semiconductor package 100 according to the example embodiment of the disclosure may be completed by covering the second semiconductor chip 180 with the encapsulant 185. The semiconductor package 100 may include a lower package 10 and an upper package 20. The lower package 10 may include the first redistribution structure 110, the conductive pillar 122, the first semiconductor chip 130, the encapsulant 142, and the second redistribution structure 150. The upper package 20 may include the second semiconductor chip 180 and the encapsulant 185.

Figures 15, 16:
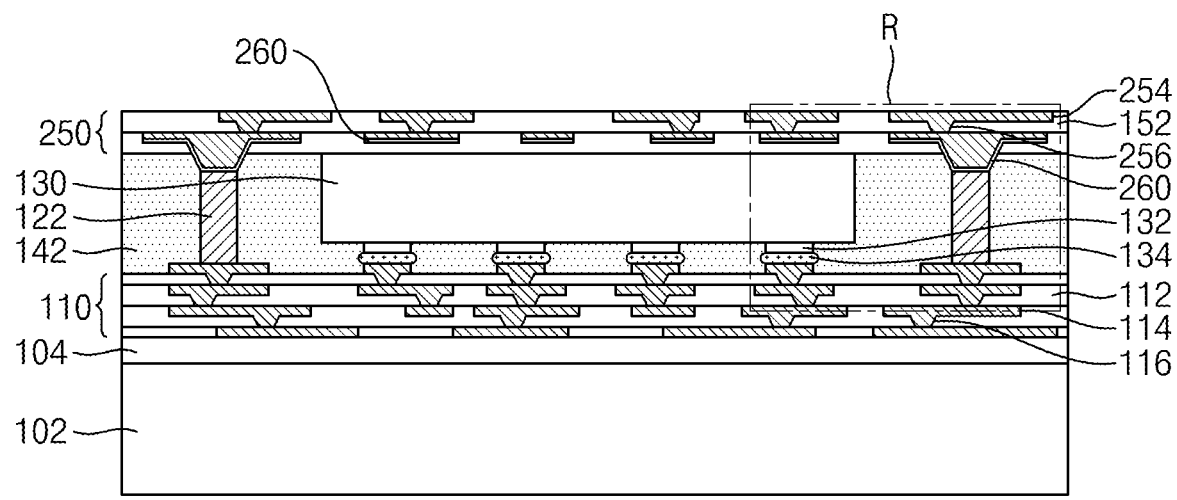
FIG. 15 is a cross-sectional view for describing a method of manufacturing a semiconductor package according to an example embodiment.
FIG. 16 is a partially enlarged view of FIG. 15.

FIG. 15 is a cross-sectional view for describing a method of manufacturing a semiconductor package 200 according to an example embodiment of the disclosure. FIG. 16 is a partially enlarged view of FIG. 15. FIG. 15 may correspond to FIG. 9, and FIG. 16 may correspond to a region R shown in FIG. 15.

Referring to FIGS. 15 and 16, the semiconductor package 200 may include a second redistribution structure 250. The second redistribution structure 250 may include interconnection patterns 254 and 255, a via 256, and a connection via 257. Further, the second redistribution structure 250 may further include a corrosion preventive layer 260. Referring to FIGS. 9 and 15, in the process of forming the second redistribution structure 250 on the first semiconductor chip 130 and the encapsulant 142, the corrosion preventive layer 260 may be disposed before the interconnection pattern 255 and the connection via 257 are formed.

The interconnection patterns 254 and 255, the via 256, and the connection via 257 of the second redistribution structure 250 may include a conductive material different from that of the conductive pillar 122. In an example embodiment, the conductive pillar 122 may include copper, and the interconnection patterns 254 and 255, the via 256, and the connection via 257 may include aluminum. However, the disclosure is not limited thereto.

Generally, an aluminum interconnection may form a film that is denser than a copper interconnection and has no problem of being diffused into silicon or an insulating film. However, the aluminum interconnection may have a disadvantage in that corrosion may be easily caused due to poor electron mobility. Specifically, galvanic corrosion may be easily caused at a portion of the aluminum interconnection in which aluminum is in contact with a dissimilar metal. As shown in FIGS. 15 and 16, the corrosion preventive layer 260 may be disposed below the interconnection pattern 255 and the connection via 257. The corrosion preventive layer 260 may prevent corrosion of the conductive pillar 122 and the connection via 257, which contain different materials. The corrosion preventive layer 260 may be formed by a deposition process such as a CVD process, a PVD process, an ALD process, or the like. The corrosion preventive layer 260 may include a conductive material. In an example embodiment, the corrosion preventive layer 260 may include Ta, TaN, Ti, TiN, W, or a combination thereof.

Figure 17:
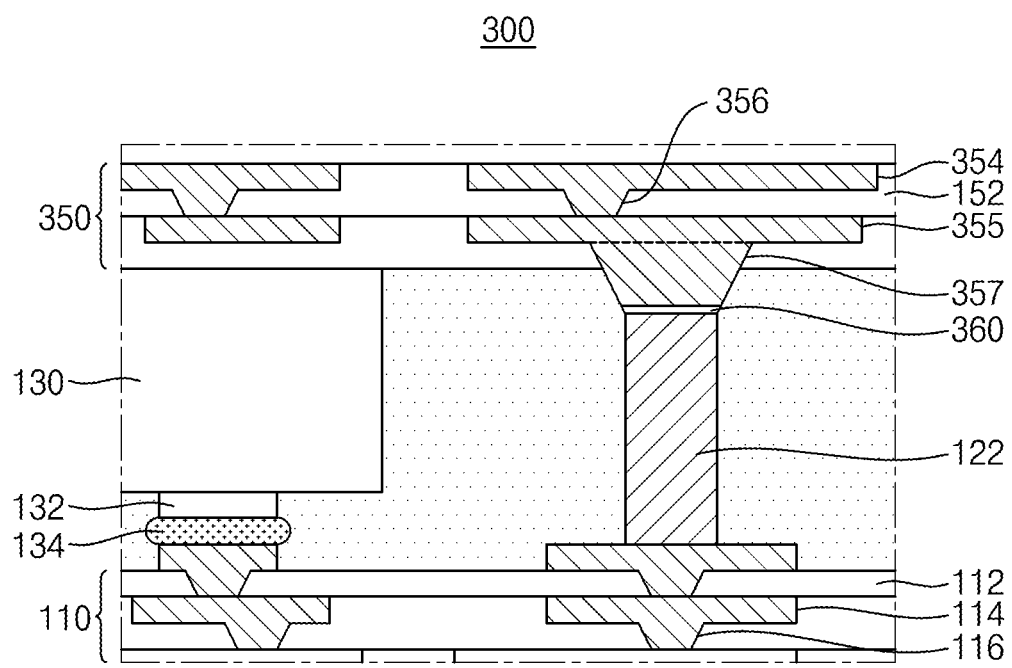
FIG. 17 is a partially enlarged view of a semiconductor package according to an example embodiment.

FIG. 17 is a partially enlarged view of a semiconductor package 300 according to an example embodiment.

Referring to FIG. 17, the semiconductor package 300 may include a second redistribution structure 350. The second redistribution structure 350 may include interconnection patterns 354 and 355, a via 356, a connection via 357, and a corrosion preventive layer 360. The corrosion preventive layer 360 may be formed on the conductive pillar 122 exposed through the opening 145 by a plating process. The corrosion preventive layer 360 may be disposed between the conductive pillar 122 and the connection via 357 and may not be disposed below the interconnection pattern 355. The corrosion preventive layer 360 may include a conductive material and may include, for example, Ni, Pd, Au, or a combination thereof.

Figure 18:
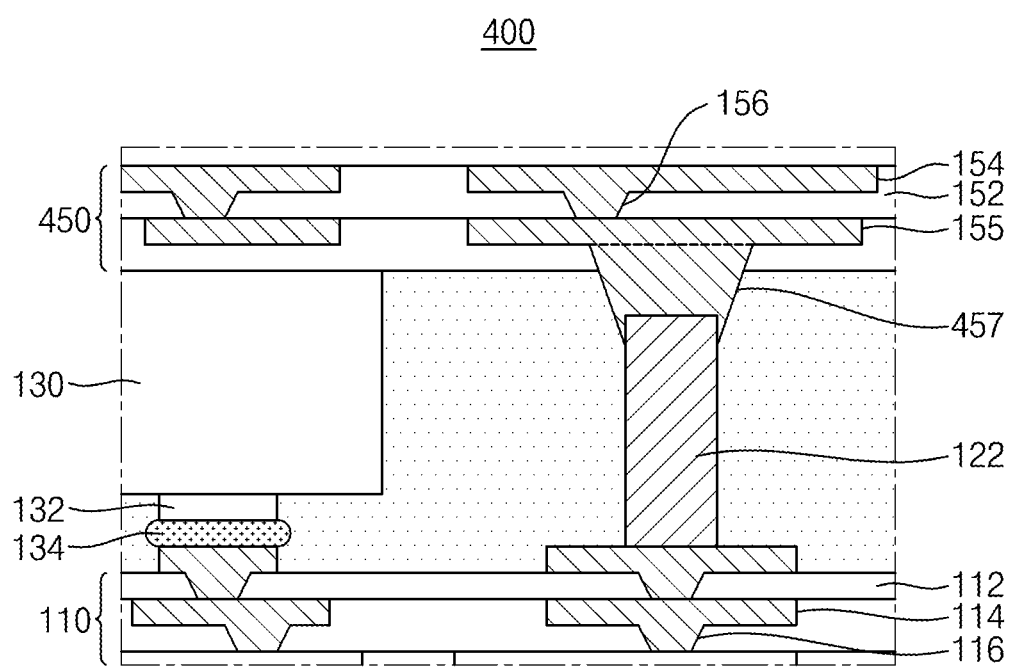
FIG. 18 is a partially enlarged view of a semiconductor package according to an example embodiment.

FIG. 18 is a partially enlarged view of a semiconductor package 400 according to an example embodiment. The semiconductor package 400 may include a second redistribution structure 450.

Referring to FIGS. 8 and 18, in the process of forming the opening 145 on the upper surface of the encapsulant 142, the opening 145 may be formed such that a lower end of the opening 145 is located at a lower level than the upper surface of the conductive pillar 122. The second redistribution structure 450 may be formed on the upper surface of the encapsulant 140 after the opening 145 is formed. The second redistribution structure 450 may include a connection via 457 connected to the conductive pillar 122. The connection via 457 may fill an entirety of an inside of the opening 145, and a lower end of the connection via 457 may be located at a lower level than the upper surface of the conductive pillar 122. The connection via 457 may include copper or aluminum. Although not shown, a barrier layer and a seed layer or a corrosion preventive layer may be disposed between the conductive pillar 122 and the connection via 457.

According to the example embodiments of the disclosure, since an upper surface of a conductive pillar is located at a lower level than an upper surface of a first semiconductor chip, the conductive pillar may not be exposed during grinding of an encapsulant, and thus a contamination problem and a problem of reduction in reliability can be prevented.

While the example embodiments of the disclosure have been described with reference to the accompanying drawings, it should be understood by those skilled in the art that various modifications may be made without departing from the scope of the disclosure. Therefore, the above-described embodiments should be considered in a descriptive sense only and not for purposes of limitation.

What is claimed is:

1. A semiconductor package comprising:
a first redistribution structure;
a first semiconductor chip disposed on the first redistribution structure;
a conductive pillar disposed on the first redistribution structure;
a first encapsulant covering an upper surface of the first redistribution structure, the conductive pillar, and side surfaces of the first semiconductor chip;
a second redistribution structure disposed on the first encapsulant and connected to the conductive pillar, the second redistribution structure including a connection via in contact with the conductive pillar;
a second semiconductor chip disposed on the second redistribution structure; and
a second encapsulant covering the second redistribution structure and the second semiconductor chip,
wherein an upper surface of the connection via has a width greater than a width of a lower surface of the connection via,
wherein a side surface of the conductive pillar and at least a portion of the connection via are surrounded by the first encapsulant,
wherein a ratio of a distance from a lower surface of the conductive pillar to the lower surface of the connection via to a distance from the lower surface of the conductive pillar to an upper surface of the first encapsulant is 0.8 or less, and
wherein a distance from the first redistribution structure to an upper surface of the conductive pillar is less than a distance from the first redistribution structure to an upper surface of the first semiconductor chip.

2. The semiconductor package of claim 1, wherein the upper surface of the first encapsulant is located at a level between the upper surface and the lower surface of the connection via.

3. The semiconductor package of claim 1, wherein the connection via has a shape of a truncated cone of which the upper surface is wider than the lower surface.

4. The semiconductor package of claim 1, wherein the connection via covers at least a portion of the side surface of the conductive pillar.

5. The semiconductor package of claim 1, wherein a surface roughness Ra of the upper surface of the first encapsulant is 0.1 µm or less.

6. The semiconductor package of claim 1, wherein an upper surface of the conductive pillar is located at a lower level than the upper surface of the first encapsulant.

7. The semiconductor package of claim 1, wherein a width of an upper surface of the conductive pillar is substantially the same as a width of the lower surface of the conductive pillar.

8. The semiconductor package of claim 1, further comprising a wire surrounded by the second encapsulant and connected to a pad disposed on an upper surface of the second redistribution structure.

9. The semiconductor package of claim 1, wherein an upper surface of the first semiconductor chip is coplanar with the upper surface of the first encapsulant.

10. A semiconductor package comprising:
a first redistribution structure;
a first semiconductor chip disposed on the first redistribution structure;
a conductive pillar disposed on the first redistribution structure;
a first encapsulant covering an upper surface of the first redistribution structure, the conductive pillar, and side surfaces of the first semiconductor chip;
a second redistribution structure disposed on the first encapsulant and connected to the conductive pillar, the second redistribution structure including a connection via in contact with the conductive pillar;
a second semiconductor chip disposed on the second redistribution structure; and
a second encapsulant covering the second redistribution structure and the second semiconductor chip,
wherein an upper surface of the connection via has a width greater than a width of a lower surface of the connection via,
wherein a side surface of the conductive pillar and at least a portion of the connection via are surrounded by the first encapsulant,
wherein a ratio of a distance from a lower surface of the conductive pillar to the lower surface of the connection via to a distance from the lower surface of the conductive pillar to an upper surface of the first encapsulant is 0.8 or less, and
wherein the second redistribution structure includes a first interconnection pattern, a second interconnection pattern on the first interconnection pattern connected to the connection via, and a via connecting the first interconnection pattern and the second interconnection pattern.

11. The semiconductor package of claim 10, wherein a height of the connection via is greater than a height of the via.

12. The semiconductor package of claim 10, wherein a width of the connection via is greater than a width of the via.

13. A semiconductor package comprising:
a first redistribution structure;
a first semiconductor chip disposed on the first redistribution structure;
a conductive pillar disposed on the first redistribution structure;

a first encapsulant covering an upper surface of the first redistribution structure, the conductive pillar, and side surfaces of the first semiconductor chip;

a second redistribution structure disposed on the first encapsulant and connected to the conductive pillar, the second redistribution structure including a connection via in contact with the conductive pillar;

a second semiconductor chip disposed on the second redistribution structure; and a second encapsulant covering the second redistribution structure and the second semiconductor chip, wherein an upper surface of the connection via has a width greater than a width of a lower surface of the connection via, wherein a side surface of the conductive pillar and at least a portion of the connection via are surrounded by the first encapsulant, and wherein a distance from the first redistribution structure to an upper surface of the conductive pillar is less than a distance from the first redistribution structure to an upper surface of the first semiconductor chip.

14. The semiconductor package of claim 13, wherein the second redistribution structure includes a first interconnection pattern, a second interconnection pattern on the first interconnection pattern connected to the connection via, and a via connecting the first interconnection pattern and the second interconnection pattern.

15. The semiconductor package of claim 13, wherein an upper surface of the first semiconductor chip is coplanar with the upper surface of the first encapsulant.

* * * * *